United States Patent [19]
Kizilyalli

[11] Patent Number: 5,821,147
[45] Date of Patent: Oct. 13, 1998

[54] INTEGRATED CIRCUIT FABRICATION

[75] Inventor: Isik C. Kizilyalli, Orlando, Fla.

[73] Assignee: Lucent Technologies, Inc., Murray Hill, N.J.

[21] Appl. No.: 570,429

[22] Filed: Dec. 11, 1995

[51] Int. Cl.$^6$ .................................................. H01L 21/336
[52] U.S. Cl. ............................................ 438/305; 438/918
[58] Field of Search .................................. 437/44, 41, 31, 437/22, 933, 935; 257/392; 438/298, 302, 305, 918

[56]             References Cited

U.S. PATENT DOCUMENTS

| | | |
|---|---|---|
| 4,530,150 | 7/1985 | Shirato . |
| 4,574,467 | 3/1986 | Halfacre et al . |
| 4,722,909 | 2/1988 | Parillo et al. .............................. 437/44 |
| 4,738,934 | 4/1988 | Johnston, Jr. et al. .................... 437/22 |
| 4,975,757 | 12/1990 | Egawa et al. . |
| 5,114,874 | 5/1992 | Custode . |
| 5,134,447 | 7/1992 | Ng et al. . |
| 5,134,448 | 7/1992 | Johnsen et al . |
| 5,244,823 | 9/1993 | Adan . |
| 5,256,583 | 10/1993 | Hollinger . |
| 5,266,510 | 11/1993 | Lee . |
| 5,270,257 | 12/1993 | Shin . |
| 5,328,864 | 7/1994 | Yoshizumi et al. . |
| 5,330,925 | 7/1994 | Lee et al. . |
| 5,344,790 | 9/1994 | Bryant et al. .............................. 437/44 |
| 5,536,962 | 7/1996 | Pfiester ..................................... 257/392 |
| 5,593,907 | 1/1997 | Anjum et al. ............................. 437/35 |

FOREIGN PATENT DOCUMENTS

| | | | |
|---|---|---|---|
| 707345 | 4/1996 | European Pat. Off. . | |
| 1-27269 | 1/1989 | Japan ....................................... | 437/44 |
| 4-245442 | 1/1992 | Japan ....................................... | 437/44 |

OTHER PUBLICATIONS

Lin et al., "Sub—100—nm p+— shallow junctions fabricated by group III dual ion implantation and rapid thermal annealing", Applied Physics Letters, 54, (18), May 1, 1989.
Hillenivs et al, A Symmetric Submicron CMOS Technology, pp. 252–255, IEDM, 1986.
Semiconductor Devices–Physics and Technology–"Crystal Growth From the Melt," pp. 307, Date Unknown.
Dorf, Richard C., The Electrical Engineering Handbook, "Integrated Circuits," CRC Press, pp. 581–584 and 1631–1635, Month Unknown, 1993.
Roddy, D., Introduction to Microelectronics, Second Edition, pp. 100–102. Date Unknown.
Wolf, Stanley, Silicon Processing for the VLSI Era, Ion Implantation Equipment, pp. 308–311, Month Unknown, 1990.
Shahidi, G.G. et al, IEEE Electron Devices Letters, Indium Channel Implant for Improved Short–Channel Behavior of Submicrometer NMOSGET's vol. 14, No. 8, Aug. 1993.
Ohguro, T. et al, Tenth Micron p–MOSFET's with Ultra Thin Epitaxial Channel Layer Grown by Ultra High Vacuum CVD, pp. 433–436 Date Unknown.
Hu et al., A Study of Deep Submicron MOSFET Sealing Based on Experiment and Simulation, pp. 669–670, Date Unkown.
VLSI Technology, Second Edition, S.M. Sze, Chapter 8, pp. 327–374, Month Unknown, 1988.

*Primary Examiner*—John Niebling
*Assistant Examiner*—Michael S. Lebentritt

[57]             ABSTRACT

Indium is employed as the shallow portion of a lightly doped drain transistor.

3 Claims, 2 Drawing Sheets

INTEGRATED CIRCUIT FABRICATION

TECHNICAL FIELD

This invention relates to methods for fabricating integrated circuits and to the integrated circuits formed thereby.

BACKGROUND OF THE INVENTION

Many MOS transistors in integrated circuits utilize so-called "lightly doped drain" (LDD) regions. The junction depth of this region is critical in determining the short channel effects for the transistor. The lightly doped drain transistor structure has, typically, both source and drain regions each of which are formed by two separate ion implantation steps. One ion implantation step is a relatively shallow implantation. A second ion implantation is a comparatively deeper implantation. The shallow implantation forms the so-called lightly doped portion of the source or drain. The lightly doped portion of the source or drain is closer to the gate than the more heavily doped and deeper portion of the source drain.

After the source drain region is formed, a variety of thermal processing steps are typically performed. The thermal processing steps cause diffusion of the source/drain region and undesirable movement of the lightly doped portion of the source or drain.

Those concerned with the development of integrated circuit fabrication have sought better methods for forming lightly doped drain structures and better lightly doped drain structures.

SUMMARY OF THE INVENTION

These concerns are addressed by the present invention which includes:

forming a gate upon a substrate; and exposing the substrate to indium dopant species, the indium penetrating the substrate, to form at least a portion of the source and drain.

DETAILED DESCRIPTION

Figure 1:
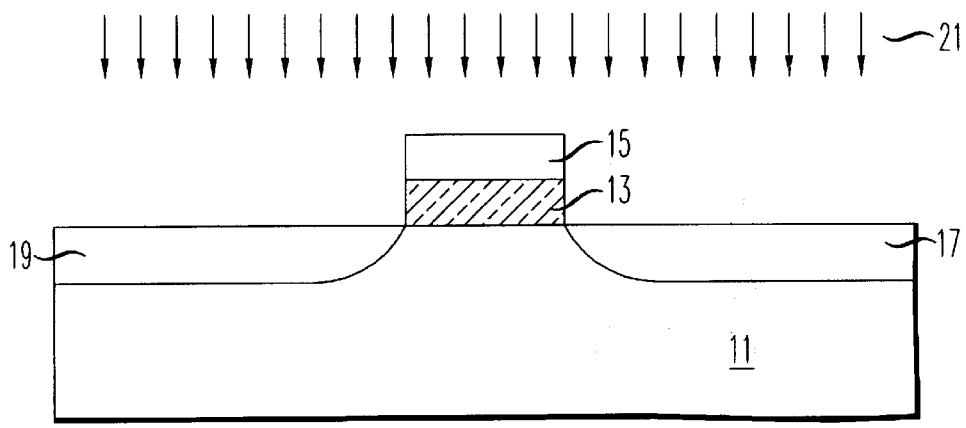
FIGS. 1,2,3, 4*a* and 4*b* are cross sectional views showing an illustrative embodiment of the present invention.
Figure 2:
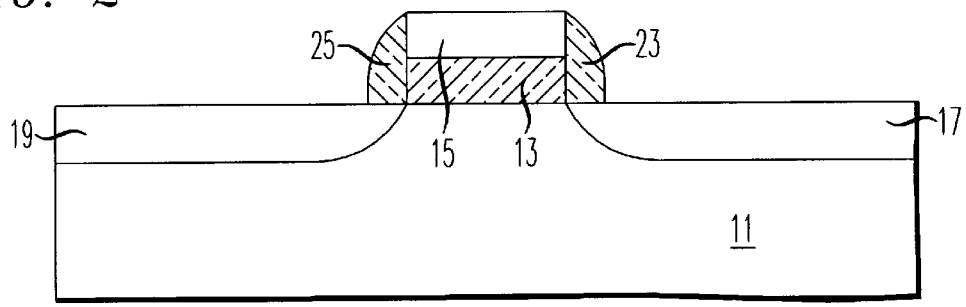

In FIG. 1, reference numeral 11 denotes a substrate which is typically silicon, epitaxial silicon, or doped silicon. Reference numeral 11 may denote, for example, a portion of a n-well of a silicon substrate. (The n-well is illustratively formed by doping silicon with phosphorus or arsenic.) Reference numerals 13 and 15 denote respectfully patterned oxide and polysilicon which, taken together, form a gate. Reference numeral 21 denotes an ion implantation species, in this embodiment, indium. Typically, the indium may be implanted at an energy of 20–100 KeV and a dose of $10^{14}$–$10^{16}$ cm$^{-2}$, thereby forming shallow, or doped regions 17 and 19. In FIG. 2, spacers 23 and 25 are created by, typically, depositing an oxide and an isotropically etching an oxide.

Figure 3:
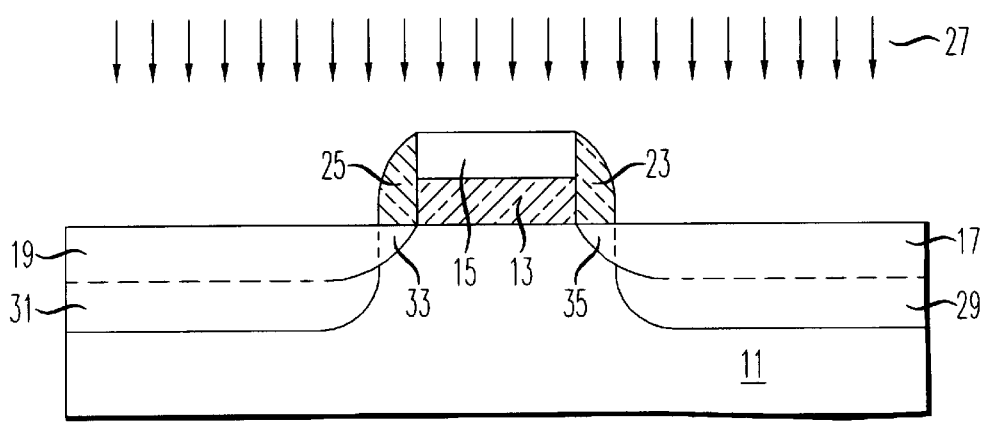

In FIG. 3, a second ion implantation, typically utilizing $BF_2$ or Boron 27 or gallium is performed to create more heavily doped and deeper regions 29 and 31. Illustratively, regions 17 and 29 taken together form a drain region with shallow indium doped extension 35. Similarly, regions 19 and 31 taken together form a source region with lightly doped indium extension 33.

Because indium has a lower coefficient of diffusion than other acceptor dopants namely boron, subsequent thermal processing will not cause as much diffusion of indium extensions 33 and 35 as previously experienced when boron or $BF_2$ implanted dopant shallow extensions were employed. The resulting transistor will manifest superior short channel behavior (i.e. reduced short channel effects).

At this point, a thermal treatment, either in a furnace or by rapid thermal annealing may be performed. Then a dielectric such as silicon dioxide formed from TEOS may be deposited and patterned to open windows to the source and drain. The windows may be fillied with conductive material such as aluminum. Further semiconductor processing may be performed.

Figure 4A:
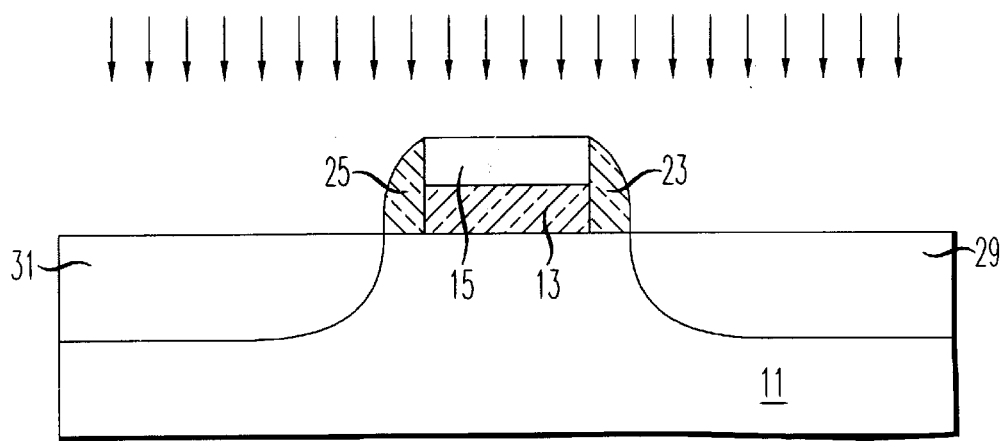
Figure 4B:
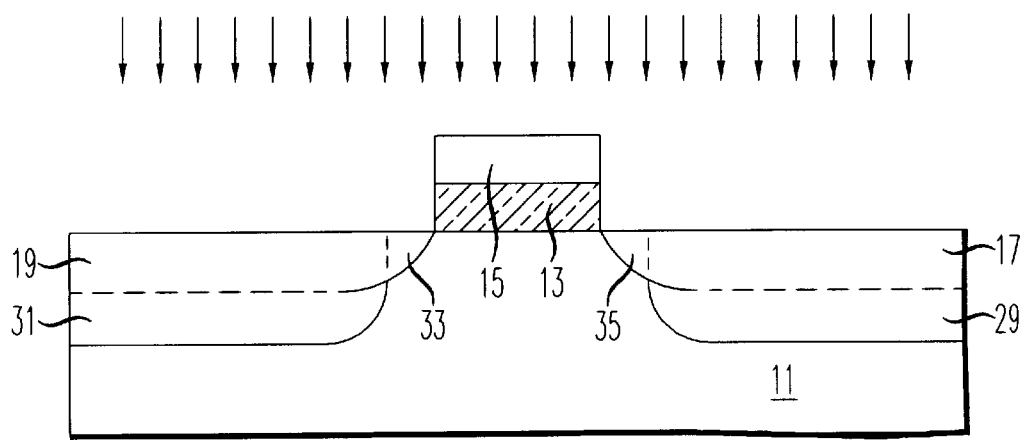

Other embodiments are contemplated. For example, indium alone might be used to form the source and drain. In other words, dopant 27 of FIG. 3 might be indium. In addition, the order of the steps depicted in FIGS. 1–3 might be reversed. In other words, spacers may be formed first, followed by a deep ion implantation. Then the spacers may be removed and a shallow indium implantation performed, as shown in FIGS. 4(*a*) and (*b*)

Alternatively, a conventional, single implant source and drain (without shallow extensions) might be formed using only indium. In other words, starting from FIG. 1, an indium ion implantation, illustratively at an energy of 20–100 KeV, preferably 60 KeV, and a dose of $10^{12}$–$10^{16}$-cm$^{-2}$ preferably $10^{14}$, cm$^{-2}$, may be performed to define the source and drain. Then, after a thermal drive in, a dielectric may be deposited and patterned to expose the source and drain. Then metal may be deposited and patterned. Standard semiconductor processing may continue from this point.

The invention claimed is:

1. A method of integrated circuit fabrication, comprising:

forming a gate upon a substrate;

implanting indium ions into said substrate;

forming spacers adjacent to said gate; and implanting a gallium dopant species into said substrate, thereby forming source and drain regions, wherein said implanted indium ions form source and drain extensions that are shallower than that of said implanted gallium dopant species forming said source and drain regions.

2. The method of claim 1, wherein said indium ions are implanted at a dose of $10^{14}$–$10^{16}$ cm$^{-2}$ and an energy of 20–100 KeV.

3. A method of integrated circuit fabrication, comprising:

forming a gate upon a substrate;

forming spacers adjacent to said gate;

implanting a gallium dopant species into said substrate, thereby forming source and drain regions;

removing said spacers; and implanting indium ions to form source and drain extensions shallower than said gallium source and drain regions.

* * * * *